United States Patent [19]

Dugan et al.

[11] Patent Number: 4,878,990

[45] Date of Patent: Nov. 7, 1989

[54] ELECTROFORMED AND CHEMICAL MILLED BUMPED TAPE PROCESS

[75] Inventors: William P. Dugan, Glendora; Rama P. Samudrala, Upland; Grace A. Rivas, Claremont, all of Calif.

[73] Assignee: General Dynamics Corp., Pomona Division, Pomona, Calif.

[21] Appl. No.: 197,794

[22] Filed: May 23, 1988

[51] Int. Cl.[4] .......................... C23F 1/02; B44C 1/22; C03C 15/00; C03C 25/06

[52] U.S. Cl. ..................................... 156/630; 29/827; 156/652; 156/656; 156/659.1; 156/661.1; 156/150; 156/645; 156/634; 156/902; 204/3; 204/15; 357/70; 361/421; 437/220; 430/313; 430/314; 430/318

[58] Field of Search ............ 156/630, 652, 656, 659.1, 156/661.1, 645, 666, 634, 901, 902, 150, 151; 204/3, 12, 15, 27, 32.1; 29/827, 874, 879, 884; 430/312, 313, 314, 318; 357/70, 71; 437/220; 174/68.5, 52 FP; 361/421

[56] References Cited

U.S. PATENT DOCUMENTS

| | | | |
|---|---|---|---|
| 2,861,029 | 11/1958 | Bain, Jr. et al. | 204/15 |
| 3,129,280 | 4/1964 | Elarde | 156/901 X |
| 3,502,519 | 3/1970 | White | 156/345 X |
| 3,567,593 | 3/1971 | Burlingame | 204/15 |
| 3,689,332 | 9/1972 | Dietrich et al. | 156/11 |
| 3,761,309 | 9/1973 | Schmitter et al. | 204/192 X |
| 3,794,536 | 2/1974 | Muska | 156/11 |
| 3,832,769 | 9/1974 | Olyphant et al. | 437/203 |
| 3,838,984 | 10/1974 | Crane et al. | 357/70 X |
| 3,868,724 | 2/1975 | Perrino | 357/70 X |
| 3,962,002 | 6/1976 | Finkbeiner et al. | 156/03 |
| 4,125,441 | 11/1978 | Dugan | 204/12 |
| 4,139,434 | 2/1979 | Dugan | 204/129.35 |
| 4,141,782 | 2/1979 | Dugan | 156/643 |
| 4,259,436 | 3/1981 | Tabuchi et al. | 156/634 X |
| 4,381,966 | 5/1983 | Rasekhi et al. | 156/630 |
| 4,443,499 | 4/1984 | Lipp | 427/258 |
| 4,564,423 | 1/1986 | Dugan | 204/12 |
| 4,754,912 | 7/1988 | Burns | 357/70 X |

FOREIGN PATENT DOCUMENTS

| | | | |
|---|---|---|---|
| 54-53641 | 4/1979 | Japan | 156/661.1 |

OTHER PUBLICATIONS

IBM Technical Disclosure Bulletin, vol. 20 No. 2, Jul., 1977 pp. 577–578.

IBM Technical Disclosure Bulletin, vol. 18 No. 5, Aug., 1975 pp. 1321–1322.

IBM Technical Disclosure Bulletin, vol. 16 No. 5, Oct., 1973 pp. 1604–1605.

*Primary Examiner*—William A. Powell
*Attorney, Agent, or Firm*—H. Bissell; Leo R. Carroll

[57] ABSTRACT

A process for producing a copper lead frame tape in which the individual fingers of the lead frame are provided with gold plated bumps. A copper foil is provided with dry film photoresist on both sides and is initially processed to provide openings in one side of the resist for electroforming of the end products directly on the copper foil. Further processing produces openings on the other resist side in locations other than opposite the first resist side bumps whereby a following chemical milling of the exposed opposite side copper yields a plurality of fingers, each consisting of an integral bump-/copper foil arrangement. The electroforming step is made possible by a novel double-cell electroplating method in which a relatively high-impedance ion path connects the two cells. Bump heights of as much as 0.0013 inch or greater are produced by the disclosed process, with uniformly excellent quality.

12 Claims, 4 Drawing Sheets

12 14 16

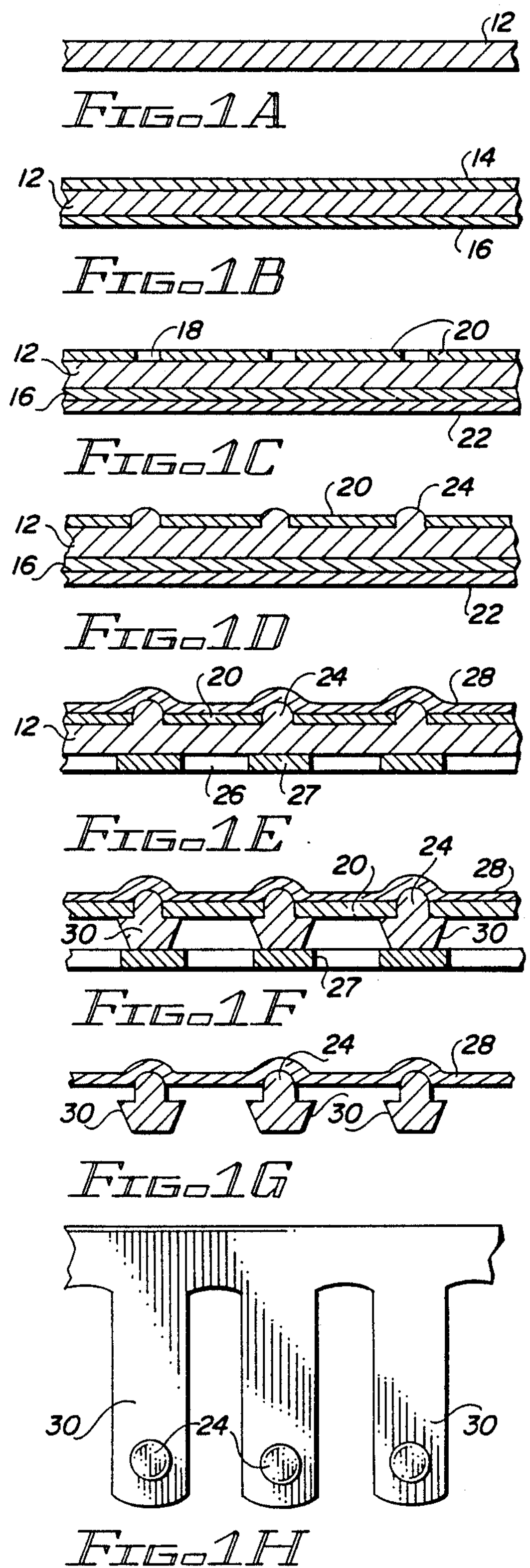
12
FIG. 1A
12
14
16
FIG. 1B
18
20
12
16
22
FIG. 1C
20
24
12
16
22
FIG. 1D
20
24
28
12
26
27
FIG. 1E
24
20
28
30
30
27
FIG. 1F
24
28
30
30
FIG. 1G
30
24
30
FIG. 1H

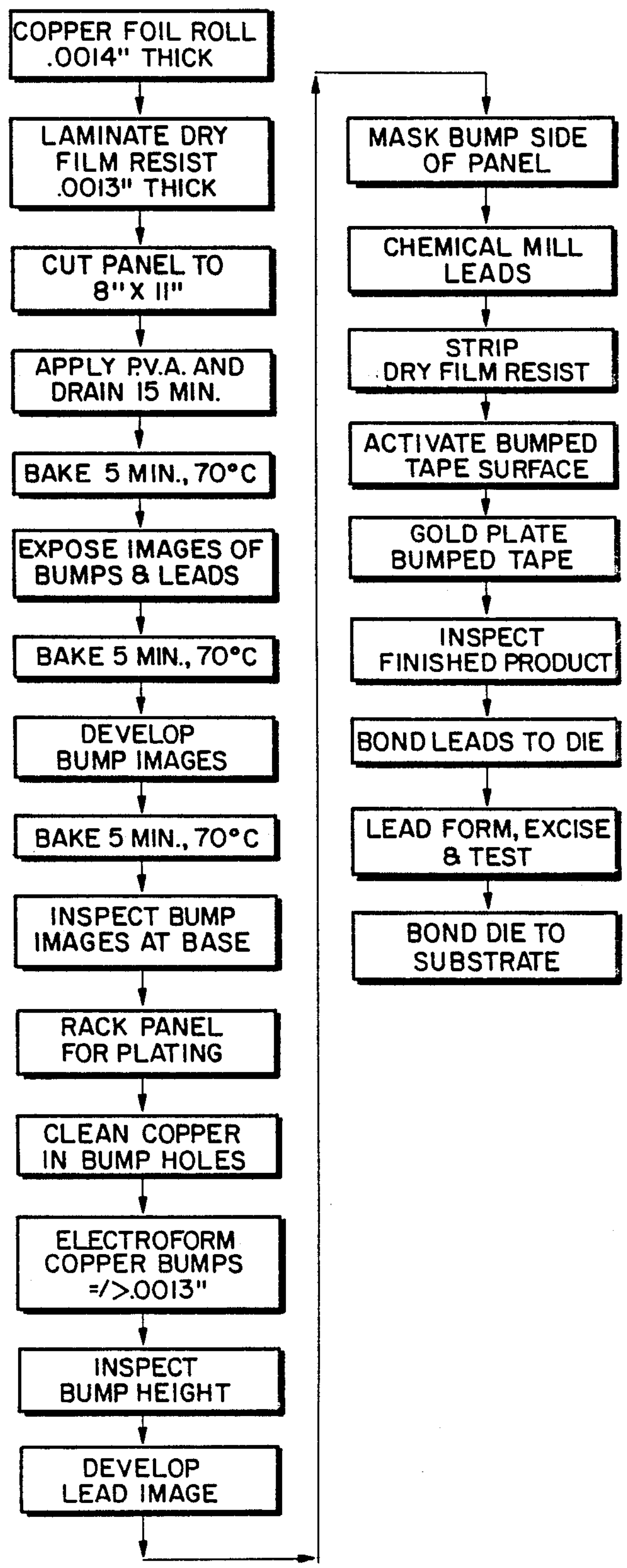
COPPER FOIL ROLL .0014" THICK
LAMINATE DRY FILM RESIST .0013" THICK
CUT PANEL TO 8"X 11"
APPLY P.V.A. AND DRAIN 15 MIN.
BAKE 5 MIN., 70°C
EXPOSE IMAGES OF BUMPS & LEADS
BAKE 5 MIN., 70°C
DEVELOP BUMP IMAGES
BAKE 5 MIN., 70°C
INSPECT BUMP IMAGES AT BASE
RACK PANEL FOR PLATING
CLEAN COPPER IN BUMP HOLES
ELECTROFORM COPPER BUMPS =/>.0013"
INSPECT BUMP HEIGHT
DEVELOP LEAD IMAGE
MASK BUMP SIDE OF PANEL
CHEMICAL MILL LEADS
STRIP DRY FILM RESIST
ACTIVATE BUMPED TAPE SURFACE
GOLD PLATE BUMPED TAPE
INSPECT FINISHED PRODUCT
BOND LEADS TO DIE
LEAD FORM, EXCISE & TEST
BOND DIE TO SUBSTRATE
FIG. 4

ELECTROFORMED AND CHEMICAL MILLED BUMPED TAPE PROCESS

CROSS-REFERENCE TO RELATED APPLICATION

The present application is generally related to the co-pending application by Dugan entitled "Double-Cell Electroplating Apparatus and Method," Ser. No. 07/197,793, filed 05/23/1988 assigned to the assignee of the present invention.

BACKGROUND OF THE INVENTION

1. Field of the Invention

The present application relates generally to methods of forming bump and lead circuits arranged on a flexible tape and, in particular, to a process in which the bump circuit is electroformed and the lead circuit is formed by chemical milling.

2. Description of the Related Art

It is well known in the art to provide carriers for semiconductor devices such as integrated circuit chips. Such carriers usually have a lead circuit represented by one surface of the carrier while the opposite surface is provided with bumps or pads for making contact with the conductive terminals of the semiconductor devices. The leads provide connections from the semiconductor terminals to other elements. The bumps or pads exposed on the surface opposite the lead circuit serve the purpose of facilitating contact with the semiconductor terminals. This is usually effected by a heat ram for thermally bonding the bumps the terminals.

One conventional practice is to generate the lead and bump circuits by chemical etching. A plate of a suitable metal, such as copper, is subjected to chemical etching through a photoresist which has been illuminated through a mask and developed to expose the metal at places adjacent the bumps which are to be provided. For example, see U.S. Pat. Nos. 4,139,434 and 4,141,782 to Dugan.

In another conventional method, both the bump circuit and the lead circuit are formed, not by a chemical process, but by electroforming. U.S. Pat. No. 4,125,441 to Dugan describes such a method. A first metal plate or base is coated with a photoresist on one surface thereof. The photoresist is removed from the areas where bumps are to be formed Where the metal is bared, indentations are chemically etched partly through the metal surface to form a bump circuit. Now the photoresist is completely removed. The surface of the metal plate is again covered with a layer of photoresist which is again removed over those areas where a lead circuit is to be formed. The next step is to chemically etch partly through the uncovered metal to form a lead circuit. At the same time the bump indentations are additionally etched to make them deeper than the lead indentations. Now a second metal is plated over the exposed surface of the first metal, the second metal being of the type which resists a chemical etch for the ba metal. Thus the first metal may consist of copper and the second of gold. The layer of gold may then be followed by a layer of nickel, a layer of copper, and a second layer of gold, all plated over the original layer of gold. Thereafter the copper plate may be removed by chemical etching.

U.S. Pat. No. 4,564,423 to Dugan discloses a method of forming reusable mandrels for fabricating bumped circuit base sheets. One method involves the selective etching of a copper sheet to develop pits or cavities at predetermined locations. A thin plating layer is deposited on the base sheet, covering the surface including the depressions to form the mandrel. After passivation of the plated surface, copper is plated thereon to form the sheet with the bumps in place. The sheet is then peeled off the mandrel so that the mandrel may be reused for making subsequent bumped sheets. An alternative method involves the selected buildup of a base metal sheet by plating with a compatible material about islands of photoresist. The photoresist is removed to leave cavities where the islands were. The surface is then plated with a thin layer of nickel to form a permanent mandrel.

In methods of forming bumps with chemical milling and conventional electroplating, the bumps have a maximum height of about 1.0 mil, and the quality and dimensions of the bumps are not consistent. An improved electroplating process is needed to achieve substantially greater bump heights having improved dimensional uniformity and quality.

SUMMARY OF THE INVENTION

A process in accordance with the present invention for producing bumped tape by electroforming and chemical milling utilizes the novel double-cell plating system disclosed in U.S. patent application Ser. No. 07/197,793, entitled "Double-Cell Electroplating Apparatus and Method." In one embodiment of the present invention the process starts with a copper foil sheet that is laminated with a layer of photoresist on each side of the sheet. The thin copper foil sheet may be taken from a roll and fed through a laminating machine, after which panels are cut out. Each sheet panel goes through a chamber where a pattern of bumps is exposed on one side and a pattern of leads exposed on the other. Thereafter the bump images are developed while the lead images are protected from developent. After further processing which includes cleaning of the copper in the bump holes, the sheet is placed in a double-cell plating system where copper bumps are electroformed.

After a sufficient bump height is reached, the lead image side is developed while the bumpside of the sheet is protected by applying tape so that the developing and etchant solution cannot reach it. Etching (chemical milling) of the leads results in a desired configuration of bumps and leads. The remaining photoresist is removed and the bumped tape surface is activated with a wash of sodium persulfate. Finally gold is plated to a minimum thickness of 0.1 mil.

The bumps which are thus produced are suitable for thermocompression bonding to a die. There are miniature pads of aluminum 0.004 inch square on the die to which the bumps are individually bonded. The leads are thereafter shaped (curved and cut), after which the other ends are bonded to the substrate. Typically the die is 0.4 inch square and there are 113 bumped leads attached by gang bonding around the edge using a combination of heat and pressure. The dimension of the bump holes in the art work is less than 2.0 mils, with the possibility of going to a dimension as fine as 1.55 mils. The uniformity of the resultant bumped leads is almost 100% in the present process, whereas previous chemical milling processes resulted in poor uniformity. Tests have shown that the bonds resulting from the present bumped leads can withstand pulls of up to 50 grams per bump. In destructive testing, the breaking of leads consistently occurs rather than the rupture of the bond at the bump.

BRIEF DESCRIPTION OF THE DRAWINGS

A better understanding of the present invention may be realized from a consideration of the following detailed description, taken in conjunction with the accompanying drawings in which:

FIGS. 1A through 1G are sectional side views through a bumped tape being produced by the present process;

FIG. 1H is a plan view of the bumped tape;

FIG. 4 is a flow diagram of the present process for bumped tape fabrication and assembly by electroforming and chemical milling;

DESCRIPTION OF THE PREFERRED EMBODIMENT

Figure 2:
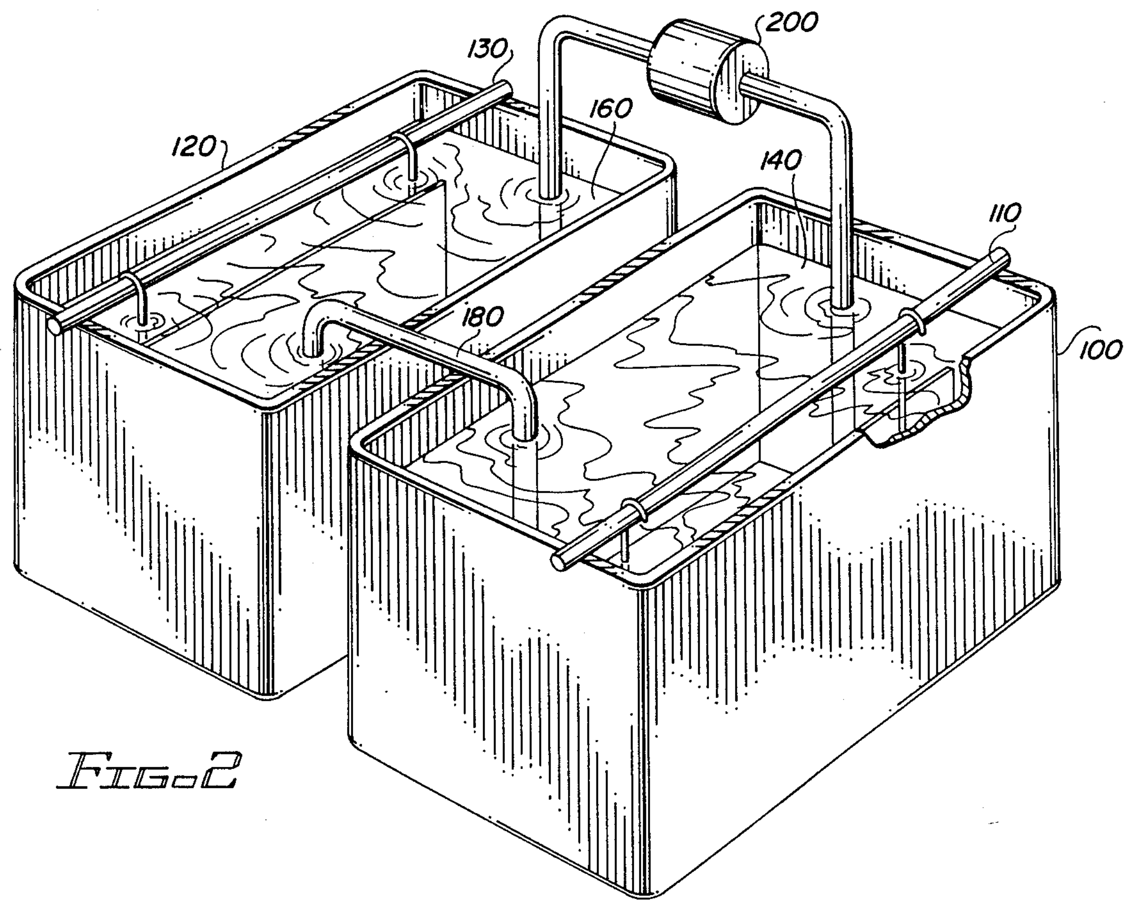
FIG. 2 is a perspective drawing of a double-cell electroplating apparatus which may be used in the present invention.

FIGS. 1A through 1F illustrate the process of the present invention for manufacturing bumped tape, which is made possible by a new method of electroplating and electroforming using a double-cell plating technique with a relatively high-impedance ion path between the cells, described further below. As shown in FIG. 1A, the process begins with a copper foil sheet 12 which is 0.0014 inch thick. The sheet 12 is laminated with a layer of photoresist 14 or 16, each 0.0013 inch thick, on each side of the copper foil sheet 12. The thin layers of copper foil 12 and photoresist 14 and 16 are taken from rolls and fed through a laminating machine, after which panels of 8×11 inch size are cut out.

The laminated sheet undergoes an application of P.V.A. (polyvinyl alcohcl) and is drained for 15 minutes. Next the sheet is baked for five minutes at 70° C. After thus having received the standard treatment for photo imaging, the sheet next enters a chamber where a pattern of bumps is expoaed on one side and a pattern of leads is exposed on the other side After baking at 70° C. for five minutes, the bumped images are developed in a "yellow room" while the lead images are protected from developent by tape 22, as shown in FIG. 1C. This is followed by a final baking at 70° C. for five minutes.

At this point the bump images 18 are inspected for vestiges of developer which may be in the corners along the base of the remaining photoresist 20. The sheet as pictured in FIG. 1C is placed in a rack and the copper in the bump holes 18 is cleaned by the application of sodium persulfate (a copper etchant) for 60 seconds.

The next step in the process is to electroform copper bumps 24 in in the bump holes 18. The accomplishment of this electroforming step is only made possible through a novel electroplating method which is the subject of application Serial No. 07/197,793, by Dugan et al, assigned to the assignee of the present invention and entitled "Double-Cell Electroplating Apparatus and Method." The disclosure of that application is incorporated herein by reference. For better understanding of the present invention, a description of that novel electroplating apparatus and method follows.

FIG. 2 shows one possible arrangement of the novel double-cell electroplating apparatus used in the present invention. A first cell 100 has an anode 110 situated therein and a second cell 120 has a cathode 130 placed in it. Cells 100 and 120 are filled with electrolytic solution 140 and 160 in amounts sufficient to contact the electrodes. A wide variety of electrolytic solutions are usable.

An example of a suitable copper plating solution is:

| | | |
|---|---|---|
| $CuSO_4.5H_2O$ | = | 70.166 grams/liter |
| $H_2SO_4$ | = | 184.643 grams/liter |
| Cl | = | 0.068 grams/liter |

FIG. 2 further shows a tube 180 which connects cells 100 and 120 and performs as a siphon. The siphon tube 180 acts to pass electrolyte 140 from cell 120 to cell 100. While FIG. 2 reveals a single tube 180, multiple tubes could be used to achieve the same effect. It is important to note that what is being disclosed is not the mere use of a siphon, but rather a means of establishing a relatively high-impedance ion path between the two cells 100 and 120, cell 120 containing the cathode 130 and ell 100 containing the anode 110.

Also shown in FIG. 2 is a combination filter and pumping apparatus 200. The pump transports the electrolyte from cell 100 to cell 120, thereby effectively continuously recirculating and mixing the electrolyte 140 and 160. The latter function is important because during the electroplating process gas is evolved at the cathode 130 which may become trapped on the surface of the object being plated, and this can cause uneven deposition. By agitating the electrolyte 160, bubbles of gas can be kept from collecting.

An additional function of the filter/pumping apparatus 200 is to filter out anodal material, dirt, or other foreign matter which may be present in the electrolyte before it enters the cathode cell 120. It is desirable to filter the electrolytic solution 140 and 160 to prevent roughness of the deposit due to extraneous materials in the solution. Although the use of a filter associated with the apparatus 200 is one convenient way of achieving this end, the filtering device could be separate from the pump. Similarly, a separate agitation means apart from the filter/pumping apparatus 200 could be used to agitate the electrolytic solution.

Figure 3:
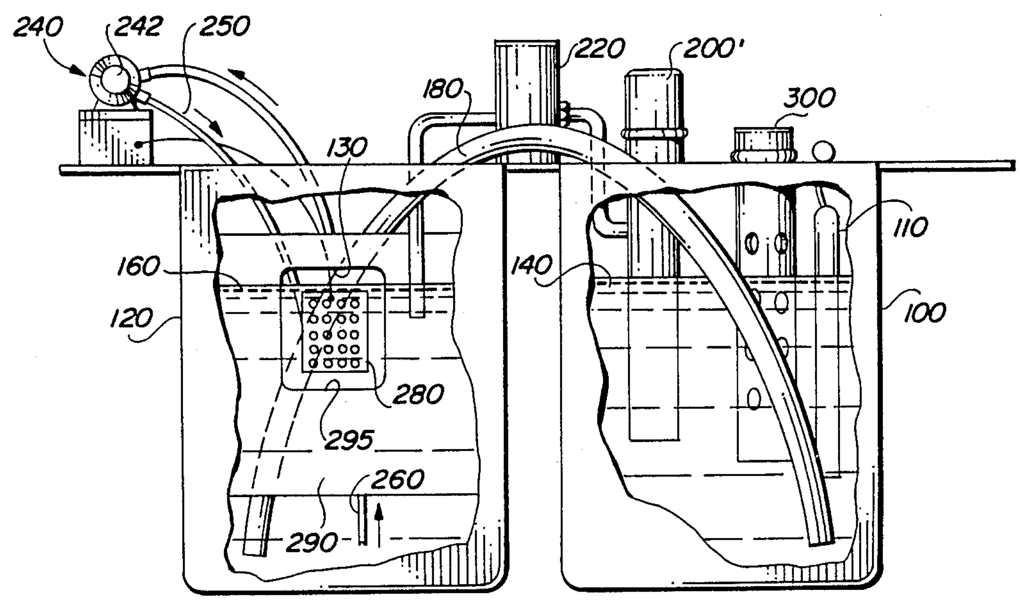
FIG. 3 is a partially broken away side view of one embodiment of the double-cell electroplating apparatus used in the invention.

FIG. 3 is a partially broken away side view of another possible double-cell electroplating arrangement which can be used in the present invention. As before, a siphon tube 180 moves electrolyte 140 from cell to cell 100 by siphoning action. Pump 200' pumps electrolyte 160 from cell 100 to cell 120. In the arrangement of FIG. 3, however, a separate filtering means 220 and agitation means 240 are provided. Agitation means 240 takes the form of a pump 242 that circulates plating solution 160 through tubes 250 and 260. Intake tube 260 accepts electrolyte from the lower part of cell 120 which is pumped by the pump 242 through tube 250 to a part of the solution where the object to be plated 280 is attached to cathode 130. Object 280 is surrounded by a plastic cathode shield 290. Cathode shield 290 comprises a plastic sleeve or envelope into which object 280 can be inserted in preparation for plating A window 295 on one side of cathode shield 290 allows electrolyte 160 to reach object 280 when it is positioned in the center thereof.

An additional feature shown in the arrangement of FIG. 3 is the heater 300 situated in cell 100 to heat the electrolytic solution. The temperature of the electrolytic solution 140, 160 affects veral of the factors in processes involved in electroplating, such as the solubility of metal salts and evolved gases and the rate at which chemical reactions take place.

The plating process used in the present invention was found in trials to proceed satisfactorily for a variety of different current densities. Particularly useful was an average current density of 20 amperes/$ft^2$ which produced a plated layer incrementation of about 0.001 inch per hour. Excellent results are also realized with a current density of about 125 amperes/$ft^2$.

As shown in FIG. 1D, immersion of the sheet panel in the double-cell plating apparatus results in the formation of copper bumps 24. After leaving the sheet panel in the electroplating apparatus for about an hour with a total electroplating current of about five milliampheres, the sheet is taken out and the bump height is checked. If the desired height of 0.0013 inch or more has not been attained, the sheet is returned to the plating cell for an additional time period.

Now the lead image side of the sheet is developed to give rise to a pattern of open areas 26 and photoresist-covered areas 27. The sheet was previously removed from the plating rack. During this lead image development the bump side of the sheet is protected by tape 28, as shown in FIG. 1E.

The next step is to chemically etch the leads while the bumps 24 are protected by tape 28. This chemical milling step results in the configuration of bumps 24 and leads 30 shown in FIG. 1F. After the chemical milling has been accomplished, the photoresist 20 and 27 is removed and the bumped tape surface is activated with another wash of sodium persulfate following removal of tape 28. The bumped tape 32 may be gold plated if desired, preferably to a minimum thickness of 0.0001 inch.

FIG. 4 is a flow chart of the process described above. It gives in detail all of the individual steps in one version of a process in accordance with the present invention for fabrication and assembly of bumped tape.

Figure 5:
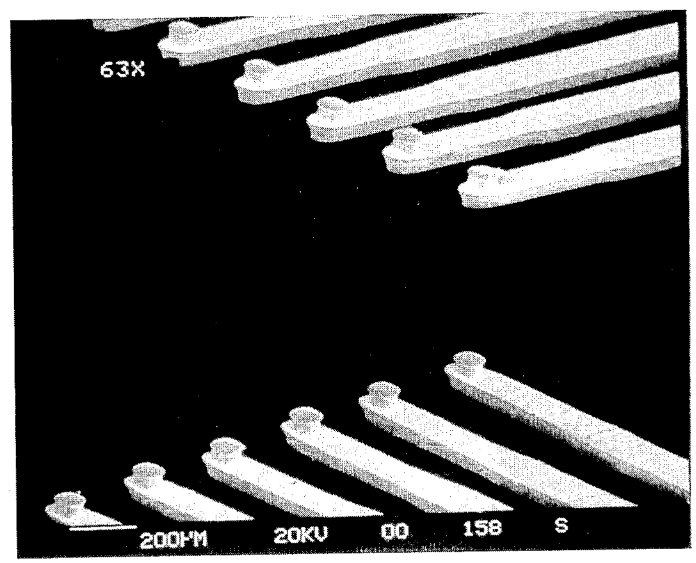
FIG. 5 is a micrograph of bumps on the lead ends of the frame after production by the present process.
Figure 6:
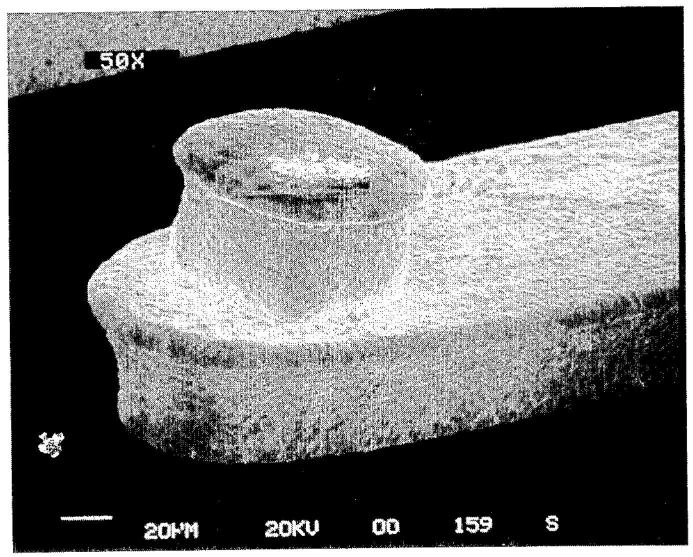
FIG. 6 is a micrograph of one bump and lead in close-up.
Figure 7:
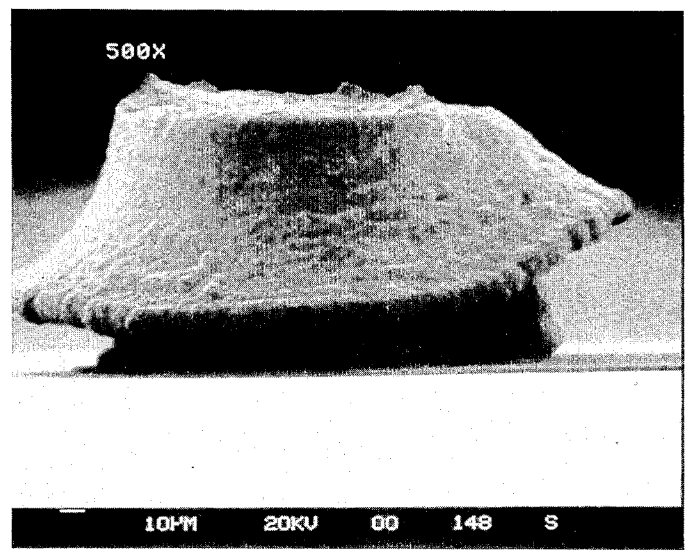
FIG. 7 is a close-up micrograph of a bump ready for bonding to a chip pad.
Figure 8:
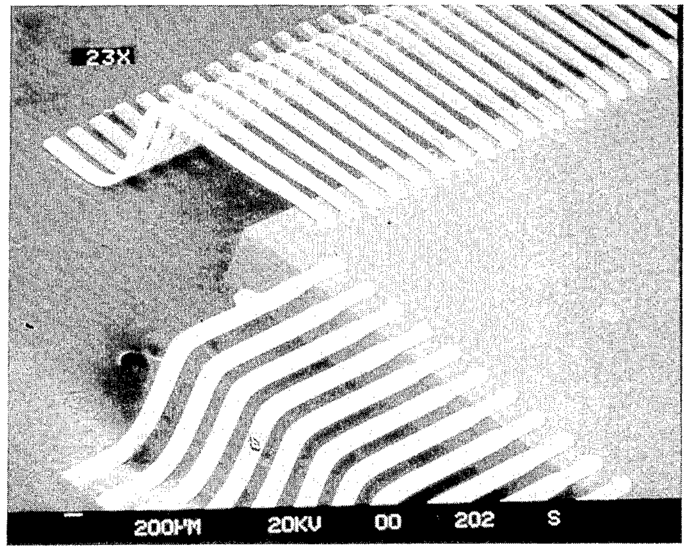
FIG. 8 is a micrograph of the leads after bonding to the die.

FIG. 5 is a photograph of bumps on lead ends produced by the present process. FIG. 6 is a photomicrograph showing a close-up view of one such bump on the end of a lead. FIG. 7 shows a bump after it has been bonded to a chip lead. The bumps are thermocompression bonded to a die. This is illustrated in the photograph of FIG. 8. The leads are shaped (curved and cut) in the form shown in FIG. 8 after thermocompression bonding has taken place. Thereafter the other ends are bonded to the substrate. The die is 0.4 inch square and there are 113 bumped leads attached by bonding around the edge. A combination of heat and pressure effects the "gang bonding" of the leads to the die. The dimension of the bump holes in the art work is less than 0.002 inch, and it is possible to go to as small a dimension as 0.00155 inch. A comparison of the quality of the end product of bumped leads produced by chemical milling and bumped leads fabricated by the present process indicates that the uniformity is almost 100% in the present process, whereas with the chemical milling process the uniformity is generally poor.

It has been shown by testing that the bonds resulting from the use of bumped leads produced by the present process can withstand a 50-gram pull per lead. In destructive testing the breaking of leads has consistently occurred before rupture of the bond at the bump. There are miniature pads of aluminum 0.004 inch square on the die to which the bumps are individually bonded.

Practice of the present invention thus provides a framework of bumped leads for connection to microchip circuitry, to achieve the necessary interconnection with printed circuit board circuits or the like. By microforming the individual bumps on the corresponding leads, rather than utilizing the plate-and-etch techniques of the prior art in conjunction with the chemical milling process which is still used in formation of the leads, where the quality of the bumps heretofore derived by prior known techniques was at best spotty, and at worst uniformly poor, the quality of the bumps fabricated in accordance with the present invention is nearly 100% acceptable. Fabrication of the present bumps can be satisfactorily achieved at smaller, finer dimensions than were possible with the prior known methods. Furthermore, the strength of the bonding of leads to the microchip pads is materially enhanced, compared with what the previously known structures were capable of.

Although there has been described above one specific method of fabricating electroformed and chemically milled bumped tape in accordance with the invention for the purpose of illustrating the manner in which the invention may be used to advantage, it will be appreciated that the invention is not limited thereto. Accordingly, any and all modifications, variations or equivalent processes which may occur to those skilled in the art should be considered to be within the scope of the invention as defined in the annexed claims.

What is claimed is:

1. A process for producing bumped lead frae tape comprising the preliminary steps of:

(a) laminating a metal foil sheet on a first side and a second side with a photoresist;

(b) simultaneously exposing said first side to an image of bumps and said second side to an image of leads;

(c) developing said image of bumps to expose a plurality of bump openings while protecting said photoresist on said second side from being developed;

(d) cleaning those parts of said metal foil sheet exposed in said bump openings; and (e) electroforming metal bumps on said metal sheet in said bump openings to a predetermined height.

2. The process of claim 1 further including the subsequent steps of:

(f) developing said lead image on said second side of said sheet;

(g) chemically milling exposed parts of said metal sheet on said second side with an etchant while protecting said first side from contact with said etchant, for a time sufficient to form a plurality of bumped leads;

(h) removing any remaining said photoresist from said first and second sides to leave a bumped tape; and (i) activating said bumped tape with a solution of sodium persulfate.

3. The process of claim 2 further including the step of overplating said bumped tape with a second metal.

4. The process of claim 3 wherein step e) comprises using a double-cell electroplating apparatus having a relatively high-impedance ion path interconnecting the cells.

5. The process of claim 4 wherein said metal foil is copper and said second metal comprises gold.

6. The process of claim 4 wherein said predetermined height is not less than 0.0013 inch.

7. The process of claim 3 wherein said overplating is done to a thickness of greater than 0.0001 inch.

8. The process of claim 4 wherein the cleaning step includes washing with sodium persulfate.

9. A process for manufacturing a bumped lead tape comprising the steps of:

(a) laminating both sides of a copper foil with dry film photoresist to form a panel;

(b) exposing said photoresist material on one side of said panel to light in accordance with a desired lead pattern and exposing the photoresist material on an opposite side of said panel to light in accordance with a desired bump pattern;

(c) baking said panel at 70° C. for about five minutes;

(d) developing said photoresist to expose said desired bump pattern while protecting said lead pattern from development;

(e) baking said panel at 70° C. for about five minutes;

(f) inspecting said bump holes at the base thereof for traces of developer and removing any which are found;

(g) connecting said panel as the cathode in one cell of a double-cell electroplating apparatus having a relatively high-impedance ion path connecting the two cells;

(h) supplying current through said double-cell electroplating apparatus for a length of time sufficient to electroform copper bumps having a height greater than or equal to 0.0013 inch in said bump holes;

(i) developing said desired lead pattern on said one side of said panel while protecting said opposite side of said panel;

(j) masking said opposite side of said panel to prevent contact of an etchant with said bumps;

(k) chemically milling said copper sheet until a plurality of bumped leads remain;

(i) unmasking said one side of said panel containing said bumps;

(m) stripping said dry film photoresist to leave a bumped tape; and (n) activating the surface of said bumped tape with sodium persulfate.

10. The process of claim 9 further including the step of plating said bumped tape with gold to a thickness greater than 0.0001 inch.

11. The process of claim 9 further comprising the following steps to produce a semiconductor die electrically coupled to a substrate:

(o) bonding said leads to a semiconductor die;

(p) forming said leads and cutting them to produce a plurality of free ends; and (q) bonding said free ends to said substrate.

12. The process of claim 11 wherein said bonding is achieved by thermocompression.

* * * * *